US010285280B2

(12) United States Patent
Iseda et al.

(10) Patent No.: US 10,285,280 B2
(45) Date of Patent: May 7, 2019

(54) CONDUCTIVE ADHESIVE FOR SCREEN PRINTING, JOINED BODY OF INORGANIC MATERIAL, AND METHOD FOR PRODUCING SAME

(71) Applicant: MITSUBOSHI BELTING LTD., Kobe-shi, Hyogo (JP)

(72) Inventors: Taisuke Iseda, Hyogo (JP); Kazutomo Kawahara, Hyogo (JP); Masahiro Iwamoto, Hyogo (JP)

(73) Assignee: Mitsuboshi Belting Ltd., Hyogo (JP)

( * ) Notice: Subject to any disclaimer, the term of this patent is extended or adjusted under 35 U.S.C. 154(b) by 0 days.

(21) Appl. No.: 14/434,024

(22) PCT Filed: Dec. 21, 2012

(86) PCT No.: PCT/JP2012/083366
§ 371 (c)(1),
(2) Date: Apr. 7, 2015

(87) PCT Pub. No.: WO2014/068798
PCT Pub. Date: May 8, 2014

(65) Prior Publication Data
US 2015/0282330 A1 Oct. 1, 2015

(30) Foreign Application Priority Data
Oct. 31, 2012 (JP) .................. 2012-239957

(51) Int. Cl.
*H05K 3/32* (2006.01)
*C09J 9/02* (2006.01)
*B22F 1/00* (2006.01)
*C09J 177/00* (2006.01)
*C09J 11/04* (2006.01)
*C09J 11/08* (2006.01)
*C08K 9/08* (2006.01)
*B22F 7/06* (2006.01)

(52) U.S. Cl.
CPC .......... *H05K 3/321* (2013.01); *B22F 1/0022* (2013.01); *B22F 1/0074* (2013.01); *C09J 9/02* (2013.01); *C09J 11/04* (2013.01); *C09J 11/08* (2013.01); *C09J 177/00* (2013.01); *B22F 7/064* (2013.01); *B22F 2001/0066* (2013.01); *C08K 9/08* (2013.01); *C08K 2201/011* (2013.01); *H05K 2203/1131* (2013.01); *Y10T 156/10* (2015.01); *Y10T 428/24851* (2015.01)

(58) Field of Classification Search
CPC ...................................................... C08K 9/08
See application file for complete search history.

(56) References Cited

U.S. PATENT DOCUMENTS 8,858,700 B2   10/2014   Endoh et al.
2010/0113647 A1   5/2010   Harada et al.

2012/0103515 A1   5/2012   Endoh et al.
2012/0236091 A1   9/2012   Iftime et al.
2012/0304876 A1*  12/2012   Miyake .............. B41F 15/0881
                                                    101/114

FOREIGN PATENT DOCUMENTS

| CN | 101206939    | 6/2008 |
| CN | 102300415    | 12/2011 |
| CN | 102490423    | 6/2012 |
| JP | 2008-258147  | 10/2008 |
| JP | 4247801 B    | 4/2009 |
| JP | 2010-031182  | 2/2010 |
| JP | 2010-131669  | 6/2010 |
| JP | 2010-150653  | 7/2010 |
| JP | 2010150653 A * | 7/2010 |
| JP | 2011-080147  | 4/2011 |
| JP | 2011-094223  | 5/2011 |
| JP | 2011-216475  | 10/2011 |
| JP | 2012-043545  | 3/2012 |
| WO | 2011/007402  | 1/2011 |
| WO | 2012/043545  | 4/2012 |

OTHER PUBLICATIONS

"BYK Additive & Instruments Press Release," Jun. 24, 2008.*
Machine Translation of JP 2010150653 A.*
Liquid Rheology Additives, BYK, 2012.*
Office Action issued in corresponding Taiwanese Patent Application No. 101150653, dated Jul. 20, 2015, 7 pages with an English translation.
Notification of Reasons for Refusal issued in corresponding Japanese Application No. 2012-239957, drafted Aug. 3, 2015, dated Aug. 11, 2015, 9 pages with an English translation.
Office Action issued in corresponding Chinese Application No. 201280076609.6, dated Nov. 25, 2016, 14 pages with English translation.
Office Action issued in corresponding Taiwanese Application No. 101150653, dated Jan. 22, 2016, 9 pages with English translation.
Office Action issued in Japanese Patent Application No. 2012-239957 dated Mar. 10, 2015—12 pages.
Extended European Search Report issued in corresponding European Patent Application, dated Jun. 6, 2016, 10 pages.
Office Action issued in corresponding Chinese Patent Application No. 201280076609.6, dated Jun. 21, 2016, 12 pages with translation.
Office Action issued in corresponding European Patent Application No. 12887449.2, dated Apr. 3, 2018, 5 pages.

(Continued)

*Primary Examiner* — Ian A Rummel
(74) *Attorney, Agent, or Firm* — Hamre, Schumann, Mueller & Larson, P.C.

(57) ABSTRACT

The present invention relates to a conductive adhesive for screen printing containing metal colloid particles (A) containing metal nanoparticles (A1) and a protective colloid (A2) containing an organic compound having a carboxyl group and a polymer dispersant having a carboxyl group, a viscosity modifier (B) having an amide bond and/or a urea bond, and a dispersion solvent (C).

7 Claims, No Drawings

(56) References Cited

OTHER PUBLICATIONS

Office Action issued in corresponding Korean Patent Application No. 10-2015-7011203, dated Feb. 6, 2018, 12 pages with an English translation.
Office Action issued in corresponding European Patent Application No. 12887449.2, dated Oct. 19, 2018, 8 pages.
Jillavenkatesa, et al., "Particle Size Characterization", NIST practice guide, Special Publication 960-1, Jan. 1, 2001 167 pages, Retrieved from Internet on Mar. 8, 2019: https://ws680.nist.gov/publication/get_pdf.cfm?pub_id=850451.

* cited by examiner

CONDUCTIVE ADHESIVE FOR SCREEN PRINTING, JOINED BODY OF INORGANIC MATERIAL, AND METHOD FOR PRODUCING SAME

TECHNICAL FIELD

The present invention relates to a conductive adhesive for screen printing which can be utilized for formation of electrodes or circuits of electronic components and the like, adhesion between components and the like, and to a joined body of inorganic material using this adhesive and a method for producing the same.

BACKGROUND ART

At the present time, conductive pastes such as silver pastes are used for forming electrodes or circuits of electronic components and the like. In addition, the conductive pastes are also used as a conductive adhesive and used for adhesion between the components and the like. As for the characteristics required as the conductive adhesive, there are mentioned, in addition to conductivity, thermal conductivity for releasing heat generated in an electronic component to the outside. In general, specific resistivity and coefficient of thermal conductivity of metal have correlation to each other, and according to the Wiedemann-Franz law, it is expressed by $\lambda = L \times T/\rho v$ (in the formula, $\lambda$ is a coefficient of thermal conductivity of metal; L is the Lorenz number; T is an absolute temperature; and $\rho v$ is a specific resistivity). That is, this law indicates that the lower the specific resistivity of conductive film, the higher the coefficient of thermal conductivity is. For that reason, metals having a low specific resistivity, such as silver, are also excellent from the standpoint of thermal conductivity.

Patent Document 1 discloses a conductive paste containing silver nanoparticles having a particle diameter of 100 nm or less, a protective colloid constituted of an organic compound having a carboxyl group and a polymer dispersant, and a solvent. When this conductive paste is baked at 100° C. or higher to remove the solvent, the silver nanoparticles are sintered, whereby a conductive film composed of a metallic bond is formed, and therefore, it is possible to form a conductive metal film close to a bulk. In addition, this patent document describes that in the case where an adherend surface is a noble metal, the silver nanoparticles are sintered on the adherend surface to undergo metallic bonding, and therefore, joining composed of a metallic bond is achieved, and it becomes possible to achieve joining with tremendously low resistivity and high heat radiation properties. Furthermore, in this patent document, after the above-described conductive paste is coated on a one-sided adherend (a so-called substrate or lead frame), the other-sided adherend (a so-called chip) is installed on the coated conductive paste, and the coated conductive paste is sandwiched by the both adherends, followed by heating to achieve adhesion.

However, according to a method of using this conductive paste (adhesive), productivity is low and a use application thereof is also limited. That is, in the above-described method, when the solvent of the coated adhesive is volatilized and dried prior to installation of a chip on the coated conductive paste, even if the chip is installed, the conductive paste does not adhere to the chip. Drying of the adhesive becomes faster when a coating area is smaller and furthermore, when a coating thickness is thinner. In a chip packaging step, there is frequently found the case where after coating the adhesive and then elapsing several hours, chip mounting is performed. In order to respond to such a step, a method of delaying a volatilization rate of the solvent to be used for the adhesive is necessary. In particular, in joining an LED (light-emitting diode) chip, since a joining area is several hundred μm□ (several hundred μm×several hundred μm) or less, drying of the adhesive is particularly fast. In coating of an adhesive by means of dispensing or pin transfer, since the coated adhesive is coated or transferred in a thickness of 100 μm or more, though drying of the adhesive is slow, a coating thickness of the adhesive varies and extrusion of the adhesive or the like is caused. Therefore, coating of the adhesive by means of dispensing or pin transfer is unsuitable in LED packaging in which high positioning precision is required. In addition, because a superfluous excess of the adhesive is coated, the costs become high.

As a high-precision and inexpensive coating method, there is mentioned a screen printing. According to the screen printing, an adhesive can be coated in a thickness of about several ten μm, and as compared with dispensing or pin transfer, it is possible to coat a printing pattern with high precision. In the screen printing, viscosity and rheology of a paste are important. In order to control the viscosity and rheology of a paste, in general conductive adhesives, resins having both adhesiveness and viscosity are used. However, in the case of using a general conductive adhesive, an interface between metal nanoparticles and an adherend surface or a gap between metal nanoparticles, is continuity due to physical contact, and hence, the electrical resistance value and heat radiation properties are lowered. Meanwhile, the metal nanoparticles has a surface protective agent composed of a surfactant chemically adsorbed on the surface thereof, and therefore, by choosing the surface protective agent, printing properties can be ensured. It is to be noted that in a metal nanoparticle paste having excellent printing properties, in general, a large quantity of the surface protective agent is adsorbed on the metal nanoparticles. In this case, since sintering between the metal nanoparticles is hindered, joining is difficult. So far as a paste in which the quantity of the surface protective agent is small relative to the metal nanoparticles is concerned, though it is possible to achieve rheology suitable for screen printing by increasing the metal concentration, in this case, drying after coating the adhesive becomes extremely fast.

It is to be noted that Patent Document 2 discloses, as a resin composition for forming an insulating protective film, a resin composition containing a resin having at least one bond derived from an acid anhydride group and/or a carboxyl group, inorganic fine particles, and a urea-modified polyamide compound and/or a urea urethane. This patent document describes that the printing precision of screen printing or the like is improved. This patent document describes that the urea-modified polyamide compound and/or urea urethane is used as a viscosity modifier. In the working examples thereof, a resin composition containing a resin having a carbonate skeleton, inorganic particles such as silica particles or barium sulfate particles, and the above-describe viscosity modifier was subjected to screen printing and then heated for curing, thereby forming a resin coating film.

However, this patent document does not describe an interaction between the inorganic fine particles and the viscosity modifier.

PRIOR ART DOCUMENT

Patent Document

Patent Document 1: JP-A-2010-150653
Patent Document 2: JP-A-2010-31182

SUMMARY OF THE INVENTION

Problem to be Solved by the Invention

In consequence, an object of the present invention is to provide a conductive adhesive in which after performing screen printing, high conductivity and adhesiveness to an inorganic material can be imparted by heating, and a joined body using this adhesive and also a method for producing the same.

Another object of the present invention is to provide a conductive adhesive in which even when a fine pattern is formed by means of screen printing, productivity is high and heat radiation properties and adhesiveness to an inorganic material can be improved, and a joined body of inorganic materials using this adhesive and also a method for producing the same.

Means for Solving the Problem

In order to solve the above-described problem, the present inventors made extensive and intensive investigations. As a result, it has been found that by combining metal colloid particles (A) containing metal nanoparticles (A1) and a protective colloid (A2) containing an organic compound having a carboxyl group and a polymer dispersant having a carboxyl group, a viscosity modifier (B) having an amide bond and/or a urea bond, and a dispersion solvent (C), after performing screen printing, high conductivity and adhesiveness to an inorganic material can be imparted by heating, leading to accomplishment of the present invention.

That is, the conductive adhesive for screen printing according to the present invention contains:

metal colloid particles (A) containing metal nanoparticles (A1) and a protective colloid (A2) containing an organic compound having a carboxyl group and a polymer dispersant having a carboxyl group;

a viscosity modifier (B) having an amide bond and/or a urea bond; and a dispersion solvent (C).

The viscosity modifier (B) may have a urea-modified polyamide skeleton.

The viscosity modifier (B) may further have a polyoxy-$C_{2-4}$-alkylene group and/or an alkyl group.

The proportion of the viscosity modifier (B) is preferably from 1 to 4 parts by mass based on 100 parts by mass of the metal nanoparticles (A1).

The proportion of the protective colloid (A2) is preferably from 1 to 3 parts by mass based on 100 parts by mass of the metal nanoparticles (A1).

The dispersion solvent (C) may be a solvent having a boiling point under atmospheric pressure of 220° C. or higher and having plural hydroxyl groups in a molecule thereof.

Further, the present invention provides a production method of a joined body of inorganic materials, containing:

a printing step of subjecting the conductive adhesive for screen printing to screen printing on a joining surface of a first inorganic material; and a sintering step of installing a joining surface of a second inorganic material on the printed conductive adhesive, sandwiching the conductive adhesive by the both inorganic materials, and then heating at 100° C. or higher to sinter the conductive adhesive.

In this production method, the joining surface of at least one of the first and second inorganic materials may contain a noble metal.

Furthermore, the present invention provides a joined body of inorganic materials obtained by the production method.

Effects of the Invention

In the present invention, by combining metal colloid particles (A) containing metal nanoparticles (A1) and a protective colloid (A2) containing an organic compound having a carboxyl group and a polymer dispersant having a carboxyl group, a viscosity modifier (B) having an amide bond and/or a urea bond, and a dispersion solvent (C), even when a use amount of the viscosity modifier (B) is small, thickening is possible; and since the viscosity modifier (B) having an amide bond and/or a urea bond is hardly accumulated at a base material surface/metal nanoparticle interface (adherend surface), the metal nanoparticles (A1) are easy to come into contact with an inorganic material, and after performing screen printing, high conductivity and adhesiveness to the organic material can be imparted by heating. That is, in the present invention, even when the adhesive is thickened to an extent necessary for screen printing properties, high conductivity can be imparted to a baked film, and it is possible to make both screen printing properties and conductivity, which have hitherto been characteristics conflicting with each other, compatible with each other. Furthermore, even when a fine pattern is formed by means of screen printing, productivity is high, and heat radiation properties and adhesiveness to an inorganic material can also be improved.

MODES FOR CARRYING OUT THE INVENTION

[Conductive Adhesive for Screen Printing]

The conductive adhesive for screen printing according to the present invention contains metal colloid particles (A) containing metal nanoparticles (A1) and a protective colloid (A2) containing an organic compound having a carboxyl group and a polymer dispersant having a carboxyl group, a viscosity modifier (B) having an amide bond and/or a urea bond, and a dispersion solvent (C).

As for the conductive adhesive, it is an ideal to ensure conductivity (and heat radiation properties) and adhesiveness to a base material (inorganic material) through bonding between the metal nanoparticles (A1) and also between the metal nanoparticles (A1) and the base material. However, in conventional conductive adhesives, in the case of a conductive adhesive composed of a mixture of metal particles and a binder resin (e.g., an epoxy resin), though adhesiveness to the base material is revealed due to the binder resin, only a physical contact is generated but metallic bonding is not caused, and therefore, sufficient conductivity is not obtained. In the case of a conductive adhesive composed of only metal nanoparticles and a solvent without using a binder resin (e.g., the conductive adhesives described in Patent Document 1), conductivity and adhesiveness can be ensured through metallic bonding. However, screen printing properties (e.g., appropriate viscosity and rheology) are insufficient and therefore are adjusted by adding, as a thickening agent, a polymer component (e.g., ethyl cellulose). However, the thickening agent is easily accumulated at a base material surface/metal nanoparticle interface (adherend surface), and adhesion by metallic bonding is hindered.

In the present invention, by using the above-described viscosity modifier (B) as the polymer component which is not accumulated at a base material surface/metal nanoparticle interface (adherend surface), the polymer component is not accumulated at the base material surface/metal nanoparticle interface (adherend surface), and hence, a bond between the base material and the metal nanoparticles (A1) is easily generated, and adhesiveness and conductivity through metallic bonding can be ensured. Further, the viscosity modifier (B) has a thickening effect by its addition in a small amount. For that reason, when the viscosity modifier (B) is used, even if a resin for an adhesion purpose (binder resin) is absent, adhesiveness can be ensured, and conductivity can be ensured while ensuring screen printing properties (e.g., appropriate viscosity and rheology).

It may be assumed that such effects of the present invention are revealed through hydrogen bonding between a hydrogen bond-forming group (e.g., an amide group and/or a urea group, etc.) which the viscosity modifier (B) has and a carboxyl group of the protective colloid (A2) surrounding the metal nanoparticles (A1). That is, it may be assumed that the viscosity modifier (B) is made adhere to the protective colloid (A2) through hydrogen bonding to become hardly accumulated at a base material surface/metal nanoparticle interface (adherend surface) (i.e., a speed at which the metal nanoparticles (A1) bond to the base material is faster than a speed at which the viscosity modifier (B) is accumulated at the base material surface/metal nanoparticle interface (adherend surface)); and that not only the metallic bond formation between the metal nanoparticles (A1) and the base material is promoted, but also the hydrogen bond-forming group which the viscosity modifier (B) undergoes hydrogen bonding to the solvent molecule or the protective colloid (A2), whereby the thickening effect is also revealed, and the screen printing becomes easy.

(A) Metal colloid particles:

The metal colloid particles (A) only have to contain the metal nanoparticles (A1) and the protective colloid (A2) containing an organic compound having a carboxyl group and a polymer dispersant having a carboxyl group. Although the metal nanoparticles (A1) and the protective colloid (A2) may be present independently of each other, from the standpoint that dispersibility of the metal nanoparticles (A1) can be improved, the metal colloid particles (A) constituted of the metal nanoparticles (A1) and the protective colloid (A2) covering those metal nanoparticles (A1) may also be adopted.

(A1) Metal nanoparticles:

Examples of a metal (metal atom) that constitutes the metal nanoparticles (A1) include transition metals (e.g., metals belonging to Group 4A of the periodic table, such as titanium, zirconium, etc.; metals belonging to Group 5A of the periodic table, such as vanadium, niobium, etc.; metals belonging to Group 6A of the periodic table, such as molybdenum, tungsten, etc.; metals belonging to Group 7A of the periodic table, such as manganese, etc.; metals belonging to Group 8 of the periodic table, such as iron, nickel, cobalt, ruthenium, rhodium, palladium, rhenium, iridium, platinum, etc.; metals belonging to Group 1B of the periodic table, such as copper, silver, gold, etc.; etc.), metals belonging to Group 2B of the periodic table (e.g., zinc, cadmium, etc.), metals belonging to Group 3B of the periodic table (e.g., aluminum, gallium, indium, etc.), metals belonging to Group 4B of the periodic table (e.g., germanium, tin, lead, etc.), metals belonging to Group 5B of the periodic table (for example, antimony, bismuth, etc.), and the like. The metal may also be a metal belonging to Group 8 of the periodic table (e.g., iron, nickel, rhodium, palladium, platinum, etc.), a metal belonging to Group 1B of the periodic table (e.g., copper, silver, gold, etc.), a metal belonging to Group 3B of the periodic table (e.g., aluminum, etc.), a metal belonging to Group 4B of the periodic table (e.g., tin, etc.), or the like. It is to be noted that in many cases, the metal (metal atom) is a metal having high coordination properties to the protective colloid (A2), for example, a metal belonging to Group 8 of the periodic table, a metal belonging to Group 1B of the periodic table, or the like.

The metal nanoparticles (A1) may also be a simple substance of the above-described metal, an alloy of the above-described metal, a metal oxide, a metal hydroxide, a metal sulfide, a metal carbide, a metal nitride, a metal boride, or the like. Those metal nanoparticles (A1) can be used solely or in combination of two or more kinds thereof. In many cases, the metal nanoparticles (A1) are generally a metal simple substance particle or a metal alloy particle. Above all, the metal constituting the metal nanoparticles (A1) is preferably a metal (a metal simple substance and a metal alloy) containing at least a noble metal (especially a metal belonging to Group 1B of the periodic table), such as silver, etc., and especially a noble metal simple substance (e.g., a silver simple substance, etc.).

The metal nanoparticles (A1) are in a nanometer size. A volume basis center particle diameter (primary particle diameter) of the metal nanoparticles (A1) can be chosen within the range of from about 1 to 150 nm, and it is, for example, from about 10 to 150 nm, preferably from about 15 to 120 nm, and more preferably from about 20 to 100 nm. When the particle diameter is too small, a specific area of the nanoparticle is large, so that a proportion of the protective colloid (A2) covering the surface becomes large, the protective colloid (A2) is hardly removed even by baking, and a metallic bonding is easily hindered. Meanwhile, when the particle diameter is too large, sintering hardly occurs, and the formation of a metallic bond becomes difficult.

(A2) Protective colloid:

The protective colloid (A2) contains an organic compound having a carboxyl group (carboxy organic compound) and further contains a polymer dispersant having a carboxyl group.

The carboxy organic compound has a carboxyl group. The number of such carboxyl groups is not particularly limited so long as it is one or more per a molecule of the carboxy organic compound, and it may be preferably from about 1 to 3. It is to be noted that in the carboxy organic compound, a part or all of the carboxyl groups may form a salt (e.g., a salt with an amine, a metal salt, etc.). In particular, in the present invention, an organic compound in which the carboxyl group (especially all carboxyl groups) does not form a salt [especially a salt with a basic compound (e.g., a salt with an amine, an amine salt, etc.)] (i.e., an organic compound having a free carboxyl group) can be suitably used.

As the carboxy organic compound, the compounds having a carboxyl group as described in the above-mentioned Patent Document 1 can be used solely or in combination with two or more kinds thereof. Among the compounds having a carboxyl group as described in the above-mentioned Patent Document 1, a saturated aliphatic carboxylic acid having a free carboxyl group and having a relatively low molecular weight is preferable from the standpoint that it separates from the metal particles or disappears at a baking temperature and forms a sintering site to improve a joining force of the inorganic material. Examples thereof include a $C_{1-16}$-alkanoic acid (alkanecarboxylic acid), such as formic acid, acetic acid, propionic acid, butyric acid, valeric acid, etc., preferably a $C_{1-12}$-alkanoic acid (e.g., a $C_{1-6}$-alkanoic acid), more preferably a $C_{1-4}$-alkanoic acid, and especially a $C_{1-3}$-alkanoic acid (e.g., a $C_{1-2}$-alkanoic acid such as acetic acid, etc.).

It is to be noted that a molecular weight of the carboxy organic compound may be, for example, 1,000 or less (e.g., from about 46 to 900), preferably 600 or less (e.g., from about 46 to 500), and more preferably 100 or less (e.g., from about 46 to 74).

In addition, a pKa value of the carboxy organic compound may be, for example, 1 or more (e.g., from about 1 to 10), and preferably 2 or more (e.g., from about 2 to 8).

By combining the above-described carboxy organic compound with a polymer dispersant having a carboxyl group, nevertheless an amount of coarse particles is small, a proportion of the metal nanoparticles (A1) can be made large and storage stability of the metal colloid particles (A) (and a dispersion liquid thereof) in the paste can also be improved.

As the polymer dispersant having a carboxyl group, the polymer dispersants described in the above-mentioned Patent Document 1 can be used solely or in combination with two or more kinds thereof Among the polymer dispersants described in Patent Document 1, poly(meth)acrylic acids [or polyacrylic acid-based resins, for example, poly(meth)acrylic acid, a polymer composed of (meth)acrylic acid as a main component, such as a copolymer of (meth)acrylic acid and a copolymerizable monomer (e.g., a (meth)acrylate, maleic anhydride, etc.), etc., and a salt thereof (e.g., an alkali metal salt such as sodium polyacrylate, etc., etc.), or the like], DISPERBYK 190 (manufactured by BYK-Chemie Japan K.K.), DISPERBYK 194 (manufactured by BYK-Chemie Japan K.K.), and the like can be preferably utilized.

A number-average molecular weight of the polymer dispersant having a carboxyl group can be chosen within the range of from 1,000 to 1,000,000, and it is, for example, from about 1,500 to 500,000, preferably from about 2,000 to 80,000, and more preferably from about 3,000 to 50,000 (especially from 5,000 to 30,000).

A proportion of the carboxy organic compound and the polymer dispersant having a carboxyl group (a proportion of solids in the case of containing a solvent and the like) may be as follow: the former/the latter (mass ratio)=from about 99.9/0.1 to 1/99, preferably from about 99/1 to 5/95, and more preferably from about 95/5 to 10/90 (especially from 95/5 to 50/50).

A proportion of the protective colloid (A2) is, for example, from about 0.1 to 10 parts by mass, preferably from about 0.3 to 8 parts by mass, and more preferably from about 0.5 to 5 parts by mass (especially from 1 to 3 parts by mass), as converted into solid contents, based on 100 parts by mass of the metal nanoparticles (A1). When the proportion of the protective colloid (A2) is too small, a proportion of coarse metal nanoparticles becomes large, whereas when it is too large, there may be the case where the metallic bonding is hindered and the conductivity is lowered.

(B) Viscosity modifier:

The viscosity modifier (i.e., a thickener or a rheology-controlling agent) (B) is an additive capable of undergoing hydrogen bonding to the carboxyl group contained in the protective colloid (A2) in the adhesive. In order to make it possible to undergo hydrogen bonding to the carboxyl group, it has a hydrogen atom and an electronegative atom (e.g., an oxygen atom and/or a nitrogen atom) in a molecule thereof, and from the standpoints that bonding strength of the hydrogen bond is large and that thickening properties and compatibility with the solvent are high, it has an amide bond and/or a urea bond (especially an amide bond). For that reason, the amide bond and/or the urea bond undergoes an interaction with the protective colloid (A2), and as a result, even if its addition amount is small, it is possible to significantly improve the viscosity of the pasty adhesive, and screen printing properties can be improved. In addition, in the case of the viscosity modifier (B) that reveals such hydrogen bonding, at the time of curing of the adhesive, the viscosity modifier (B) is hardly accumulated on the adherend surface of the base material and hardly hinders metallic joining.

On the other hand, in the case of a polymer (resin) that does not undergo hydrogen bonding to the protective colloid (A2) or a polymer having small bonding strength of the hydrogen bond to the protective colloid (A2), under curing conditions, the resin is easily accumulated at the base material surface/metal nanoparticle interface before a sintering reaction (metallic bonding) of the metal nanoparticles (A1) on the noble metal surface of the base material is generated, and metallic bonding is hardly generated (i.e., a speed at which the resin is accumulated at the base material surface/metal nanoparticle interface is faster than a sintering speed of the metal nanoparticles on the base material surface). Meanwhile, in the case of the viscosity modifier (B) capable of undergoing hydrogen bonding to the protective colloid (A2) (a viscosity modifier acting as a hydrogen bonding assistant), a part or the whole of the viscosity modifier (B) is restrained by the hydrogen bonding to the protective colloid (A2), and therefore, it may be assumed that under curing conditions, the sintering reaction (metallic bonding) of the metal nanoparticles (A1) is generated faster than the accumulation of the viscosity modifier (B) on the surface of the base material, whereby metallic joining can be achieved (i.e., a sintering speed of the metal nanoparticles (A1) on the base material surface is faster than a speed at which the viscosity modifier (B) is accumulated at the base material surface/metal nanoparticle interface).

As for the viscosity modifier (B), a structure in which hydrogen bonding to the carboxyl group of the protective colloid (A2) is easily undergone is preferable, and a structure having a urea-modified polyamide skeleton is especially preferable.

In order to improve dispersibility in the adhesive, the viscosity modifier (B) may have, in addition to the above-described polyamide skeleton (especially a urea-modified polyamide skeleton), a (poly)oxy-$C_{2-4}$-alkylene group (e.g., a hydroxyethoxy group, a polyoxyethylene group, a hydroxypropoxy group, a polyoxypropylene group, etc.) or an alkyl group (e.g., a $C_{1-12}$-alkyl group such as a methyl group, an ethyl group, a butyl group, etc.). These groups may be included solely or in combination with two or more kinds thereof (e.g., a combination of a (poly)oxyethylene group, a (poly)oxypropylene group, and an alkyl group, etc.). Of these, a (poly)oxy-$C_{2-4}$-alkylene group (especially a (poly)oxyethylene group) is excellent in dispersibility in a hydrophilic dispersion solvent, and an alkyl group is excellent in dispersibility in a hydrophobic dispersion solvent.

The viscosity modifier (B) may also be a compound represented by the formula (1): $R^1$-A-U-$R^2$-U-A-$R^1$ (in the formula, $R^1$ is a hydroxy (poly)$C_{2-4}$-alkoxy group or an alkyl group; A is a urea-modified polyamide group; U is a urea group; and $R^2$ is a (poly)oxy-$C_{2-4}$-alkylene group or an alkylene group).

In the viscosity modifier (B) having a polyamide skeleton (especially a urea-modified polyamide skeleton), a proportion of the polyamide skeleton (especially a urea-modified polyamide skeleton) is, for example, from about 1 to 95% by mass, preferably from about 5 to 90% by mass, and more preferably from about 10 to 80% by mass relative to the whole of the viscosity modifier (B).

A number-average molecular weight of the viscosity modifier (B) is, for example, from about 1,000 to 1,000,000, preferably from about 5,000 to 500,000, and more preferably from about 10,000 to 200,000 (especially from 50,000 to 150,000).

A proportion of the viscosity modifier (B) is, for example, from about 0.1 to 10 parts by mass, preferably from about 0.3 to 8 parts by mass, and more preferably from about 0.5 to 5 parts by mass (especially from 1 to 4 parts by mass), as converted into solid contents, based on 100 parts by mass of the metal nanoparticles (A1). When the proportion of the viscosity modifier (B) is too small, an action of the hydrogen bonding to the protective colloid (A2) of the metal nanoparticles (A1) is small and liquid dripping easily occurs, and therefore, there may be the case where screen printing becomes difficult. Meanwhile, when the proportion of the viscosity modifier (B) is too large, there may be the case where metallic joining with the adherend surface becomes difficult.

(C) Dispersion solvent:

Although the dispersion solvent (C) only has to be able to disperse the above-described metal nanoparticles (A1) (or the metal colloid (A)) in the adhesive, a solvent whose boiling point under atmospheric pressure is 220° C. or higher is preferable from the standpoint of screen printing properties. The boiling point under atmospheric pressure of the dispersion solvent (C) is, for example, from about 220 to 300° C., preferably from about 230 to 280° C., and more preferably from about 240 to 270° C. When the boiling point of the dispersion solvent (C) is too low, in the case of coating the conductive adhesive by means of screen printing to form a pattern having, for example, a thickness of from about 5 to 20 μm and a width of from about 30 to 100 μm, drying is so vigorous that the solvent is dried before performing chip package mounting, whereby adhesion failure is easily caused. Meanwhile, when the boiling point is too high, the solvent is hardly volatilized under curing conditions of the conductive adhesive (generally at from 100 to 300° C. for from 3 to 120 minutes), the adhesive layer is easily damaged, it is necessary to increase the curing temperature or to prolong the curing time, and deterioration of a semiconductor chip or reduction of productivity is easily caused.

Furthermore, as the dispersion solvent (C), a solvent having a hydroxyl group is preferable from the standpoint that a delay of drying is easily revealed. In particular, when a solvent having plural hydroxyl groups (e.g., from 2 to 3 hydroxyl groups, and preferably two hydroxyl groups) in one molecule is used, it becomes possible to conduct chip mounting without being dried for several hours after printing. While a reason why a solvent having two hydroxyl groups in one molecule (i.e., a diol) is suitable especially for delaying the drying as compared with an alcohol in which a boiling point of the solvent is the same degree (i.e., a solvent having one hydroxyl group in one molecule) is not elucidated yet, it can be assumed that the hydroxyl groups of the diol are easily undergo hydrogen bonding to the protective colloid (A2).

Examples of such a dispersion solvent (C) include an aliphatic alcohol [e.g., a $C_{10-20}$-alcohol such as 1-decanol (229° C.), 1-undecanol (243.5° C.), 1-tetradecanol (295° C.), etc.], a cellosolve [e.g., ethylene glycol monophenyl ether (244.7° C.), diethylene glycol monobutyl ether (230.4° C.), triethylene glycol monomethyl ether (249° C.), etc.], an aliphatic diol [e.g., 1,4-butanediol (229° C.), 1,5-pentanediol (239 to 242° C.), etc.], a glycol [e.g., diethylene glycol (245° C.)], and an aromatic diol [e.g., m-xylene-4,6-diol (276 to 279° C.), p-xylene-2,6-diol (277 to 280° C.), 3,4-toluenediol (251° C.), 3,4-xylenol (225° C.), etc.]. These dispersion solvents (C) can be used solely or in combination of two or more kinds thereof.

Of these dispersion solvents (C), an aliphatic diol, a glycol, and an aromatic diol are preferable, and an aliphatic diol such as 1,5-pentanediol is especially preferable.

A concentration of the metal nanoparticles (A1) in the conductive adhesive for screen printing may be, for example, from about 30 to 95% by mass, preferably from about 50 to 93% by mass, and more preferably from about 60 to 90% by mass (especially from 65 to 85% by mass). It is to be noted that in the conductive adhesive, the metal nanoparticles (A1) covered by the protective colloid (A2) are also in a nanometer size, and a volume basis center particle diameter (primary particle diameter) thereof and the like can be chosen within the same range as that described above.

The conductive adhesive for screen printing of the present invention may contain customary additives, for example, a coloring agent (e.g., a dye, a pigment, etc.), a hue modifier, a dye fixing agent, a gloss imparting agent, a metal corrosion preventive, a stabilizer (e.g., an antioxidant, a UV absorber, etc.), a surfactant or dispersant (e.g., an anionic surfactant, a cationic surfactant, a nonionic surfactant, an ampholytic surfactant, etc.), a dispersion stabilizer, a thickening agent or viscosity modifier other than the above-described viscosity modifier (B), a humectant, a thixotropy-imparting agent, a levelling agent, a defoaming agent, a bactericide, a filler, etc. according to a use application thereof In addition, it may further contain a binder resin within the range where the effects of the present invention are not impaired. These additives can be used solely or in combination of two or more kinds thereof.

In the conductive adhesive for screen printing of the present invention, the metal colloid particles (A) can be prepared by a customary method, for example, a method of reducing a metal compound corresponding to the above-described metal nanoparticles (A1) in a solvent in the presence of the protective colloid (A2) and a reducing agent. In detail, it can be produced by the production method described in the above-mentioned Patent Document 1, or the like. Furthermore, the conductive adhesive can be prepared by kneading the metal colloid particles (A) with the viscosity modifier (B) and the dispersion solvent (C) by using a mortar or the like. The viscosity modifier (B) and/or the dispersion solvent (C) may be added dividedly, and the water or solvent incorporated into the adhesive may be removed by using a heater such as a dryer, etc.

[Joined Body of Inorganic Materials and Joining Method]

The conductive adhesive for screen printing of the present invention is suitably used for joining inorganic materials. In detail, a joined body of inorganic materials is obtained through a printing step of subjecting the above-described conductive adhesive to screen printing on a joining surface of a first inorganic material; and a sintering step of installing a joining surface of a second inorganic material on the printed conductive adhesive, sandwiching the conductive adhesive by the both inorganic materials, and then heating at 100° C. or higher to sinter the a conductive adhesive. That is, the joined body of inorganic materials of the present invention is obtained by allowing the above-described conductive adhesive to intervene between the first inorganic material and the second inorganic material and sintering the conductive adhesive.

Although the inorganic material may be an inorganic material such as glass, a carbon material, etc., since the conductive adhesive contains the metal nanoparticles (A1), from the standpoint of increasing a joining force, a material in which at least a joining surface thereof contains a metal (or a metal is present on a joining surface) (especially a material in which almost all surface of a joining surface thereof is constituted of a metal) is preferable. Examples of the metal include the metal simple substance, alloy and metal compound exemplified in the section of the metal nanoparticles (A1), and the like. Of these, a metal simple substance or alloy is preferable. A combination of a metal simple substance that constitutes the metal nanoparticles (A1) and a metal simple substance that constitutes the joining surface of the inorganic material (or each of metal simple substances that constitute an ally) may be selected according to a crystal structure such as a simple cubic lattice structure (sc), a face-centered cubic lattice structure (fcc), a body-centered cubic lattice structure (bcc), a hexagonal close-packed structure (hcp), etc. It may be a combination of different crystal structures, but a combination of the same crystal structures (e.g., a combination of fcc structures, a combination of bcc structures, etc.) is preferable. In addition, it is preferable that lattice constants are close to each other, too, and a lattice constant of the metal simple substance that constitutes the joining surface may be from about 0.8 to 1.2 times (especially from 0.86 to 1.17 times) relative to a lattice constant of the metal simple substance that constitutes the metal nanoparticles (A1). It may be assumed that when the lattice constants of the both are adjusted so as to fall within such a range, the mutual crystal lattices are coordinated with each other, so that a good metallic bond is formed at the interface. In addition, an atomic radius of the metal simple substance that constitutes the joining surface may be from about 0.8 to 1.2 times (especially from 0.85 to 1.15 times) relative to an atomic radius of the metal simple substance that constitutes the metal nanoparticles (A1). When the atomic radiuses of the both are adjusted so as to fall within such a range, solubilities of the mutual atoms are large, so that they are easily melted together at the interface. For example, in the case where the metal nanoparticles (A1) are constituted of silver (fcc, lattice constant a: 3.614 Å (angstroms), atomic radius: 1.422 Å), the metal that constitutes the joining surface is preferably at least a metal (e.g., a metal simple substance and a metal alloy) containing a noble metal (especially a metal belonging to Group 1B of the periodic table) such as silver, gold (fcc, lattice constant a: 4.078 Å, atomic radius: 1.439 Å), etc., copper (fcc, lattice constant a: 3.614 Å, atomic radius: 1.276 Å), nickel (fcc, lattice constant a: 3.524 Å, atomic radius: 1.244 Å), or the like, and especially a noble metal simple substance (e.g., a gold or palladium (fcc, lattice constant a: 3.89 Å, atomic radius: 1.373 Å) simple substance, etc.). That is, in the case where the base material is constituted of a metal compound such as aluminum nitride (AlN), aluminum oxide ($Al_2O_3$), etc., or a nonmetal, it is preferable to subject the joining surface to a surface treatment with a metal simple substance or a metal alloy. Examples of the surface treatment method include sputtering or plating with a metal containing a noble metal, and the like. In the case where the joining surface of the inorganic material contains a metal, though the metal that constitutes the metal nanoparticles (A1) and the metal contained on the joining surface of the inorganic material may be different from each other, they are preferably the same metal or metals belonging to the same group.

The first inorganic material and the second inorganic material to be joined may be a different material from each other, or may be the same material. Although a shape of the inorganic material is not particularly limited, for example, it may be a shape in which a contact area between the materials to be joined becomes large, for example, a shape in which the joining surface is planar (generally a plate- or sheet-like shape, a film-like shape, or a foil-like shape), or the like, or may be a wire-like shape or a linear shape.

As a method of screen printing, a customary method can be utilized. A coating thickness is from about 1 to 50 μm, preferably from about 30 to 30 and more preferably from 5 to 20 μm. Furthermore, in the present invention, it is possible to perform printing with a fine pattern, and for example, a width (wire diameter) of the pattern is, for example, from about 10 to 500 μm, preferably from 20 to 300 μm, and more preferably from about 30 to 100 μm. A screen plate is, for example, from about 100 to 1,000 meshes, preferably from about 200 to 800 meshes, and more preferably from about 300 to 600 meshes.

A baking temperature for sintering the conductive adhesive only has to be 100° C. or higher, and it is, for example, from about 100 to 500° C., preferably from about 120 to 400° C., and more preferably from about 150 to 350° C. (especially from 180 to 300° C.). In addition, prior to baking, preheating may be performed at a temperature of, for example, from about 80 to 200° C. (especially from 100 to 150° C.). At the time of baking, a pressure may be applied, and the baking may be performed in a state of applying a load of, for example, from about 1 to 500 g/cm$^2$, preferably from about 3 to 300 g/cm$^2$, and more preferably from about 5 to 100 g/cm$^2$. It is to be noted that the baking may be performed in air, or may be performed in an inert gas such as a nitrogen gas, an argon gas, etc.

A baking treatment time (heating time) may be, for example, from about 1 minute to 10 hours, preferably from about 20 minutes to 5 hours, and more preferably from about 30 minutes to 3 hours according to the baking temperature and the like.

EXAMPLES

The present invention is hereunder described in more detail on the basis of the following Examples, but it should not be construed that the present invention is limited to these Examples. In the following Examples, measurement methods or evaluation methods in respective physical properties and raw materials used in the Examples are shown below. It is to be noted that all "parts" and "%" are on a mass basis unless otherwise indicated.

Example 1

(Preparation of Silver Colloid Particles)

Into 100 g of ion-exchanged water were charged 66.8 g of silver nitrate, 10 g of acetic acid (manufactured by Wako Pure Chemical Industries, Ltd., boiling point: 118° C.) and 0.7 g of a polymer dispersant having a carboxy group (COOH-containing polymer) ("DISPERBYK 190" manufactured by BYK-Chemie Japan K.K., acid value: 10 mgKOH/g, active ingredient: 40%, prime solvent: water), followed by vigorous stirring. Thereto was gradually added 100 g of 2-dimethylaminoethanol (manufactured by Wako Pure Chemical Industries, Ltd.). After stirring at 75° C. for 1.5 hours, a spherical silver powder was produced as a black precipitate. Removal of a supernatant by means of decantation and a dilution operation with water were repeated, and after dilution was performed to an extent of 1,000 times the initial value, the precipitate was recovered by means of suction filtration, thereby obtaining a wet cake of silver nanoparticles protected by a carboxy group-containing protective colloid (silver colloid particles).

(Preparation of Conductive Adhesive)

To the above-described wet cake was added 1,5-pentanediol (manufactured by Wako Pure Chemical Industries, Ltd., boiling point: 242° C.) as a solvent, and thereafter, water was removed while kneading in a mortar, thereby obtaining a silver nanoparticle dispersion paste having a silver concentration of 88.0%.

To 100 parts of the above-described silver nanoparticle dispersion paste were added 22.2 parts of 1,5-pentanediol and 8.8 parts of a viscosity modifier ("BYK-431" manufactured by BYK-Chemie Japan K.K., urea-modified polyamide, active ingredient: 25%, prime solvent: isobutanol/monophenyl glycol), followed by kneading in a mortar while applying a warm-air dryer, and the isobutanol and monophenyl glycol contained in the viscosity modifier were removed, thereby obtaining a conductive adhesive having a silver concentration of 70.8%.

(Evaluation of Screen Printing Properties)

The above-described conductive adhesive was printed on a copper substrate plated with nickel/gold (the adherend surface was gold) by using a screen printing plate having a wire diameter of 18 μm, 500 meshes, and an emulsion thickness of 10 μm, thereby forming a comb pattern of L/S=50/50 μm, which was then evaluated according to the following criteria.

A: The wire width after printing is a wire width of less than ±10% relative to the target wire width.

B: The wire width after printing is a wire width that does not satisfy the above-described criteria.

(Adhesiveness and Dryness)

The above-described conductive adhesive was printed on a copper substrate plated with nickel/gold (the adhesive surface was gold) by using a screen printing plate having a wire diameter of 18 μm, 500 meshes, and an emulsion thickness of 10 μm, thereby forming a pattern of 500 μm☐ (500 μm×500 μm) on the substrate. After printing, the resultant was allowed to stand at room temperature (25° C.) for 0, 30, 60, 180, or 300 minutes, respectively, followed by confirming with an optical microscope on whether or not the printed material was dried. Specifically, the printed material was shaven by tweezers, and the case where the dried material separated was evaluated as "separation". Subsequently, a chip was mounted on the printed conductive adhesive pattern, and shear strength was confirmed. The shear strength was measured with "Universal Bond Tester Series 4000" manufactured by DAGE under conditions of a test speed of 330 μm/s and a test height of 50 μm. In addition, with respect to a sample which was obtained by immediately after printing, mounting a chip and curing at 200° C. for 90 minutes, in addition to the shear strength, a failure mode was observed and evaluated on whether it was cohesive failure (metallic bonding) or interfacial separation (nonmetallic bonding). It is to be noted that as the chip, a chip obtained by providing a film by sputtering with titanium, platinum and gold in this order (the adhesive surface was gold) on aluminum nitride was used.

(Specific Resistivity)

The above-described conductive adhesive was coated on a slide glass (a trade name: "SLIDE GLASS S1225" manufactured by Matsunami Glass Ind., Ltd.) with an applicator and baked at 200° C. for 90 minutes to form a conductive film having a thickness of 3 μm. A specific resistivity of the conductive film was calculated from a surface resistance obtained by a four-point probe method and a film thickness obtained by a contact-type thickness meter.

Example 2

To 100 parts of the silver nanoparticle dispersion paste prepared in Example 1 were added 16.7 parts of 1,5-pentanediol and 4.4 parts of a viscosity modifier (BYK-431), followed by kneading in a mortar while applying a warm-air dryer, and the isobutanol and monophenyl glycol contained in the viscosity modifier were removed, thereby obtaining a conductive adhesive having a silver concentration of 75%. The resulting conductive adhesive was evaluated in the same manners as in Example 1.

Example 3

To 100 parts of the silver nanoparticle dispersion paste prepared in Example 1 were added 9.7 parts of 1,5-pentanediol and 2.2 parts of a viscosity modifier (BYK-431), followed by kneading in a mortar while applying a warm-air dryer, and the isobutanol and monophenyl glycol contained in the viscosity modifier were removed, thereby obtaining a conductive adhesive having a silver concentration of 80%. The resulting conductive adhesive was evaluated in the same manners as in Example 1.

Example 4

To 100 parts of the silver nanoparticle dispersion paste prepared in Example 1 were added 9.8 parts of 1,5-pentanediol and 1.1 parts of a viscosity modifier (BYK-431), followed by kneading in a mortar while applying a warm-air dryer, and the isobutanol and monophenyl glycol contained in the viscosity modifier were removed, thereby obtaining a conductive adhesive having a silver concentration of 85%. The resulting conductive adhesive was evaluated in the same manners as in Example 1.

Example 5

To 100 parts of the silver nanoparticle dispersion paste prepared in Example 1 were added 33.4 parts of 1,5-pentanediol and 13.2 parts of a viscosity modifier (BYK-431), followed by kneading in a mortar while applying a warm-air dryer, and the isobutanol and monophenyl glycol contained in the viscosity modifier were removed, thereby obtaining a conductive adhesive having a silver concentration of 65%. The resulting conductive adhesive was evaluated in the same manners as in Example 1.

Comparative Example 1

The silver nanoparticle dispersion paste prepared in Example 1 was used as it was and evaluated in the same manners as in Example 1.

Comparative Example 2

A paste obtained by adding 1,5-pentanediol to the silver nanoparticle dispersion paste prepared in Example 1 to make the silver concentration to 70% was used and evaluated in the same manners as in Example 1.

Comparative Example 3

To 100 parts of a silver nanoparticle dispersion paste prepared in the same manner as that in Example 1 except for changing the solvent to butyl carbitol acetate were added 4.4 parts of butyl carbitol acetate and 5.6 parts of a thickening agent ("EC-200" manufactured by Nissin Kasei Co., Ltd., high-molecular weight ethyl cellulose, active ingredient: 15%, prime solvent: butyl carbitol acetate), followed by kneading in a mortar, thereby obtaining a conductive adhesive having a silver concentration of 80%. The resulting conductive adhesive was evaluated in the same manners as in Example 1.

Comparative Example 4

To 100 parts of a silver nanoparticle dispersion paste prepared in the same manner as that in Example 1 except for changing the solvent to butyl carbitol acetate were added 4.4 parts of butyl carbitol acetate and 21.3 parts of a thickening agent (EC-200), followed by kneading in a mortar, thereby obtaining a conductive adhesive having a silver concentration of 70%. The resulting conductive adhesive was evaluated in the same manners as in Example 1.

Comparative Example 5

The same evaluations as in Example 1 were performed, except that 22.2 parts of 1,5-pentanediol and 5.5 parts of a polymer having a carboxyl group (DISPERBYK 190) as a viscosity modifier were added to 100 parts of the silver nanoparticle dispersion paste prepared in Example 1, followed by kneading in a mortar while applying a warm-air dryer, the water contained in the viscosity modifier was removed, thereby obtaining a conductive adhesive having a silver concentration of 70%.

The evaluation results of the adhesives obtained in the Examples and Comparative Examples are shown in Table 1.

As is clear from the results of Table 1, the adhesives of the Examples are excellent in screen printing properties and adhesiveness, whereas the adhesives of the Comparative Examples are poor in adhesiveness or screen printing properties.

While the invention has been described in detail and with reference to specific embodiments thereof, it will be apparent to one skilled in the art that various changes and modifications can be made therein without departing from the spirit and scope of the present invention.

The present application is based on Japanese Patent Application No. 2012-239957 filed on Oct. 31, 2012, the contents of which are incorporated herein by reference.

INDUSTRIAL APPLICABILITY

The conductive adhesive of the present invention can be utilized as an adhesive between inorganic materials such as metal materials, etc., and for example, it can be utilized for formation of electrodes or circuits of electronic components and the like, adhesion between components, and the like.

The invention claimed is:

1. A conductive adhesive for screen printing, comprising:
metal colloid particles (A) containing metal nanoparticles (A1) and a protective colloid (A2) containing an organic compound having a carboxyl group and a polymer dispersant having a carboxyl group;
a viscosity modifier (B) having a urea-modified polyamide skeleton; and
a dispersion solvent (C),
wherein the dispersion solvent (C) has a boiling point under atmospheric pressure of 220° C. or higher and plural hydroxyl groups per molecule,
the viscosity modifier (B) has a polyoxy-$C_{2-4}$-alkylene group and/or an alkyl group, and
the viscosity modifier (B) is a compound represented by the formula (1):

$$R^1\text{-A-U-}R^2\text{-U-A-}R^1,$$

where $R^1$ is a hydroxy (poly)$C_{2-4}$-alkoxy group or an alkyl group; A is a urea-modified polyamide group; U

TABLE 1

| | Screen printing properties | Shear strength (kgf/chip) Standing time until chip mounting after printing/min | | | | | Failure mode | Specific resistivity (μΩ · cm) | Silver concentration (%) | Viscosity modifier | Viscosity modifier/ silver 100 (parts) |
| --- | --- | --- | --- | --- | --- | --- | --- | --- | --- | --- | --- |
| | | 0 | 30 | 60 | 180 | 300 | | | | | |
| Ex. 1 | A | 0.84 | 0.79 | 0.81 | 0.83 | 0.75 | Cohesive failure | 4 | 71 | Polyamide | 2.5 |
| Ex. 2 | A | 1.4 | 1.5 | 1.3 | 1.4 | x | Cohesive failure | 3 | 75 | Polyamide | 1.3 |
| Ex. 3 | A | 1.8 | 1.7 | 1.7 | x | x | Cohesive failure | 3 | 80 | Polyamide | 0.6 |
| Ex. 4 | A | 2.4 | 1.8 | 1.9 | x | x | Cohesive failure | 3 | 85 | Polyamide | 0.3 |
| Ex. 5 | A | 0.61 | 0.65 | 0.65 | 0.59 | 0.64 | Cohesive failure | 4 | 65 | Polyamide | 3.8 |
| Comp. Ex. 1 | A | 2.8 | 1.8 | x | x | x | Cohesive failure | 3 | 88 | No | 0 |
| Comp. Ex. 2 | B | 1.2 | 1.1 | 1.1 | 1.3 | 1.2 | Cohesive failure | 3 | 70 | No | 0 |
| Comp. Ex. 3 | A | 0.04 | 0.03 | 0.03 | x | x | Interfacial separation | 3 | 80 | Ethyl cellulose | 1 |
| Comp. Ex. 4 | B | 0.03 | 0.02 | 0.03 | 0.03 | x | Interfacial separation | 3 | 70 | Ethyl cellulose | 3.6 |
| Comp. Ex. 5 | B | 0.06 | 0.04 | 0.05 | 0.08 | x | Interfacial separation | 3 | 70 | COOH-containing polymer | 2.5 | is a urea group; and $R^2$ is a (poly)oxy-$C_{2-4}$-alkylene group or an alkylene group.

2. The conductive adhesive for screen printing according to claim 1, wherein a proportion of the viscosity modifier (B) is from 1 to 4 parts by mass based on 100 parts by mass of the metal nanoparticles (A1).

3. The conductive adhesive for screen printing according to claim 1, wherein a proportion of the protective colloid (A2) is from 1 to 3 parts by mass based on 100 parts by mass of the metal nanoparticles (A1).

4. A production method of a joined body of inorganic materials, comprising:
subjecting the conductive adhesive for screen printing of claim 1 to screen printing on a joining surface of a first inorganic material;
installing a joining surface of a second inorganic material on the conductive adhesive printed on the joining surface of the first inorganic material; and
sandwiching the conductive adhesive by both of the first and the second inorganic materials, and then heating at 100° C. or higher to sinter the conductive adhesive to form a sintered film between the first and the second inorganic materials,
wherein the sintered film has a thickness from 1 to 50 μm.

5. The production method according to claim 4, wherein the joining surface of at least one of the first and second inorganic materials contains a noble metal.

6. The conductive adhesive for screen printing according to claim 1, wherein the urea-modified polyamide skeleton accounts for 10 to 80% by mass of the viscosity modifier (B).

7. The conductive adhesive for screen printing according to claim 1, wherein a number-average molecular weight of the viscosity modifier (B) is from 50,000 to 150,000.

* * * * *